(12) United States Patent
Inubushi et al.

(10) Patent No.: US 9,693,415 B1
(45) Date of Patent: Jun. 27, 2017

(54) PHOTOELECTRIC SWITCH

(71) Applicant: Keyence Corporation, Osaka (JP)

(72) Inventors: Hiroki Inubushi, Osaka (JP);
Tomoyuki Saito, Osaka (JP)

(73) Assignee: Keyence Corporation, Osaka (JP)

( * ) Notice: Subject to any disclaimer, the term of this patent is extended or adjusted under 35 U.S.C. 154(b) by 0 days.

(21) Appl. No.: 15/285,496

(22) Filed: Oct. 5, 2016

(30) Foreign Application Priority Data

Dec. 14, 2015 (JP) ................. 2015-243149

(51) Int. Cl.
| | | |
|---|---|---|
| *H05B 37/02* | (2006.01) | |
| *H03K 17/94* | (2006.01) | |
| *H01J 40/14* | (2006.01) | |
| *H05B 33/08* | (2006.01) | |
| *F21V 5/04* | (2006.01) | |
| *F21V 29/70* | (2015.01) | |
| *F21V 9/08* | (2006.01) | |
| *F21Y 115/10* | (2016.01) | |

(52) U.S. Cl.
CPC .......... *H05B 33/0866* (2013.01); *F21V 5/04* (2013.01); *F21V 9/08* (2013.01); *F21V 29/70* (2015.01); *H03K 17/941* (2013.01); *H05B 37/0227* (2013.01); *F21Y 2115/10* (2016.08)

(58) Field of Classification Search
CPC  H05B 33/08; H05B 33/0845; H05B 33/0866; H05B 37/02; H05B 37/0218; H05B 37/0227; H05B 37/029; F21V 29/70; F21V 5/04; F21V 9/08; H03K 17/941; F21Y 2115/10; H01J 40/14; G05G 19/02

USPC ..... 315/149–159, 209 R, 291, 307; 250/221, 250/221.1, 227.11; 340/540, 555–557
See application file for complete search history.

(56) References Cited

U.S. PATENT DOCUMENTS

| | | | | |
|---|---|---|---|---|
| 5,270,541 A | * | 12/1993 | Matuzaki | ............. H03K 17/943 250/227.11 |
| 6,124,936 A | | 9/2000 | Okamoto | |
| 6,323,481 B2 | | 11/2001 | Ueki | |
| 6,392,214 B1 | | 5/2002 | Okamoto | |

(Continued)

FOREIGN PATENT DOCUMENTS

| | | | |
|---|---|---|---|
| JP | 2000-121440 A | 4/2000 | |
| JP | 2000-121441 A | 4/2000 | |

(Continued)

*Primary Examiner* — Jimmy Vu
(74) *Attorney, Agent, or Firm* — Kilyk & Bowersox, P.L.L.C.

(57) ABSTRACT

There is provided a photoelectric switch that prevents erroneous detection at the time of detecting a label pasted on a workpiece, a component assembled to a workpiece, a register mark printed on a sheet-like member, or the like, to improve detection accuracy. The photoelectric switch includes: a first light projecting unit; a second light projecting unit a light receiving unit for receiving a reflected light from the first detection area to generate a first light reception signal, and receiving a reflected light from the second detection area to generate a second light reception signal; a casing accommodating the first light projecting unit, the second light projecting unit, and the light receiving unit; and a detection signal generating unit for generating a detection signal based on at least one of the specific wavelength components of the first light reception signal and the second light reception signal.

6 Claims, 14 Drawing Sheets

(56) References Cited

U.S. PATENT DOCUMENTS

| | | | |
|---|---|---|---|
| 7,098,441 B2 | 8/2006 | Yamaguchi et al. | |
| 2014/0131555 A1* | 5/2014 | Iida ..................... | G01J 1/4228 |
| | | | 250/208.2 |
| 2015/0108376 A1 | 4/2015 | Kawaguchi | |

FOREIGN PATENT DOCUMENTS

| | | |
|---|---|---|
| JP | 2005-127869 A | 5/2005 |
| JP | 2005-291748 A | 10/2005 |
| JP | 2008-175743 A | 7/2008 |

\* cited by examiner

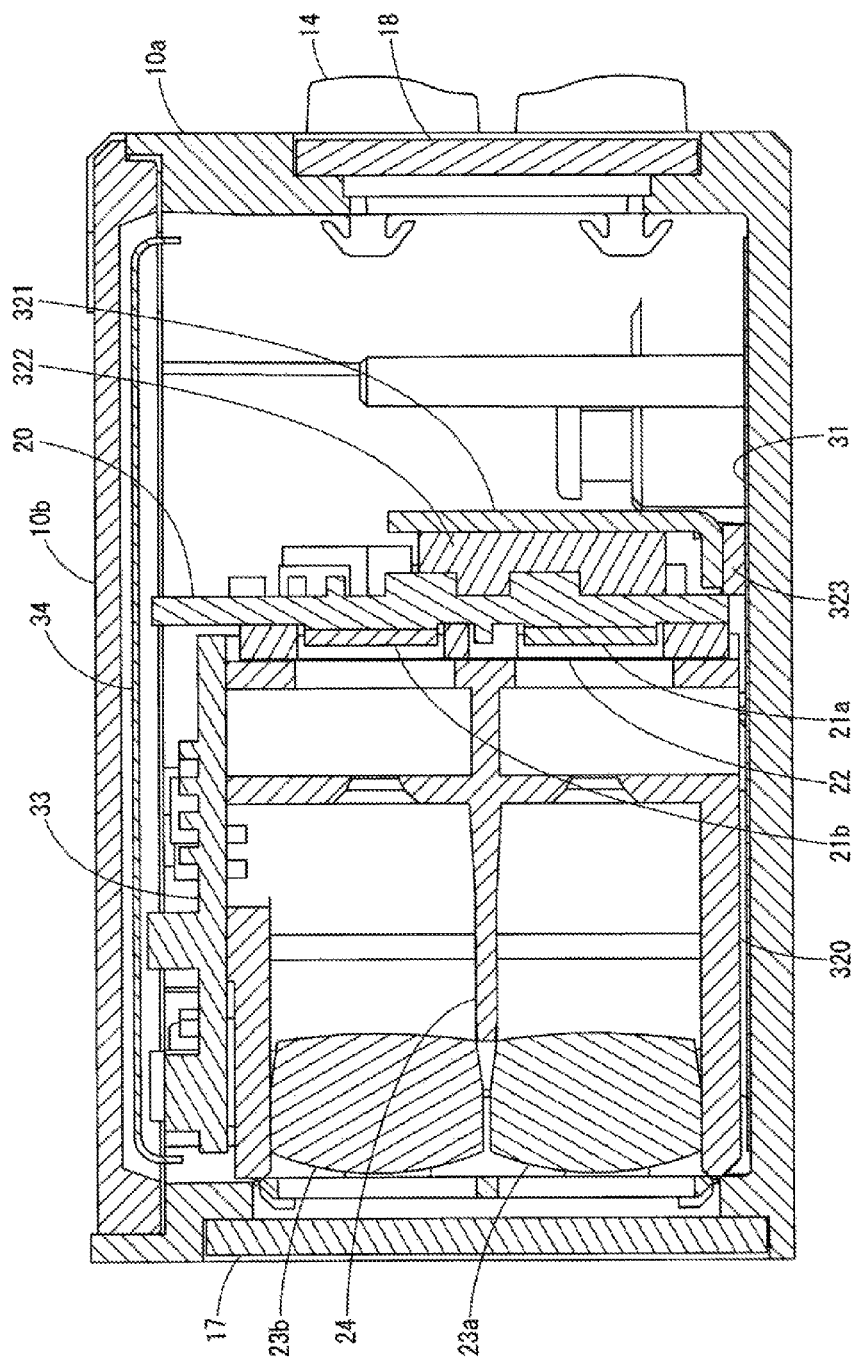
FIG. 2 A-A SECTIONAL VIEW

B-B SECTIONAL VIEW

FIG. 7A
FIG. 7B
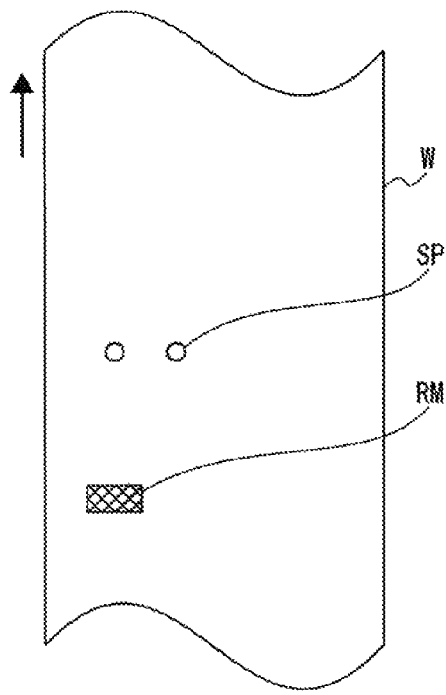
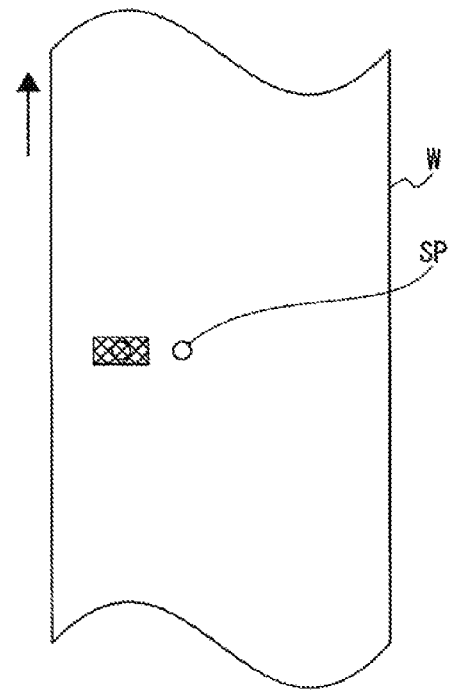

PHOTOELECTRIC SWITCH

CROSS-REFERENCE TO RELATED APPLICATIONS

The present application claims foreign priority based on Japanese Patent Application No. 2015-243149, filed Dec. 14, 2015, the contents of which is incorporated herein by reference.

BACKGROUND OF THE INVENTION

1. Field of the Invention

The present invention relates to a photoelectric switch, and more specifically relates to improvement in photoelectric switch that receives a reflected light from a detection area to perform workpiece determination.

2. Description of Related Art

A photoelectric switch is a detector for detecting a workpiece by use of a light. The photoelectric switch projects a detected light, and receives a light reflected by or a light transmitted through a workpiece, or some other light, to perform workpiece determination. Based on the result of the workpiece determination, the photoelectric switch generates a detection signal. Types of the photoelectric switch include: a light receiving amount-type photoelectric switch that performs workpiece determination by use of a light receiving amount of a reflected light or a transmitted light from a detection area including a workpiece; a distance measurement-type photoelectric switch that performs workpiece determination by measuring a distance to the workpiece, and a color discrimination-type photoelectric switch that performs workpiece determination by discriminating a color of the workpiece surface.

The light receiving amount-type photoelectric switch performs workpiece discrimination through use of variation in light receiving amount due to a difference in reflectance or color of the workpiece surface, a difference in distance to the workpiece, a difference in tilt (tilt angle) of the workpiece surface, or the like. This is a general-purpose photoelectric switch applicable to a large number of uses.

Meanwhile, the distance measurement-type photoelectric switch measures a characteristic in accordance with the shape of the workpiece as a distance to the workpiece, to perform the workpiece determination. This is less susceptible to variation in reflectance and color of the workpiece surface and variation in tilt (tilt angle) of the workpiece surface. Further, the color discrimination-type photoelectric switch performs the workpiece determination by use of the color of the workpiece surface. This is less susceptible to variation in reflectance of the workpiece surface, variation in distance to the workpiece, and variation in tilt (tilt angle) of the workpiece surface.

A conventional color discrimination-type photoelectric switch is provided with three light emitting elements for respectively generating red, green, and blue detected lights, and one light receiving element for receiving a reflected light to generate a light reception signal (e.g., Unexamined Japanese Patent Publication No. 2000-121440, Unexamined Japanese Patent Publication No. 2000-121441, Unexamined Japanese Patent Publication No. 2005-127869, and Unexamined Japanese Patent Publication No. 2005-291748). In this sort of photoelectric switch, based on light receiving amount levels $R_k$, $G_k$, $B_k$ of the three colors, obtained by sequentially turning on the respective light emitting elements in a time-division manner, a color is represented by a ratio of the light receiving amount levels of the three colors: $r_k = R_k/M_k$, $g_k = G_k/M_k$, $b_k = B_k/M_k$ (a sum of the light receiving amounts: $M_k = R_k + G_k + B_k$). It is then determined whether or not a ratio $r_1$, $g_1$, $b_1$ of the light receiving amount levels, acquired at the time of the workpiece determination, is coincident with a ratio $r_0$, $g_0$, $b_0$ of the light receiving amount levels of a previously registered reference color. Specifically, the ratio of the light receiving amount levels of each color is compared with the ratio of the light receiving amount levels of the reference color, to obtain a coincidence degree of the two pieces of color information. This coincidence degree is compared with a threshold for determination, to perform the workpiece determination.

The light receiving amount level of the reference color is defined based on the light receiving amount level of each color acquired at the timing instructed by the user. For example, based on a plurality of light receiving amount levels acquired within a predetermined period or on a ratio of the light receiving amount levels, the maximum value and the minimum value are obtained for each color component, and a median value of the maximum value and the minimum value is specified as the light receiving amount level, or the ratio of the light receiving amount levels, of the reference color.

The conventional photoelectric switch described above uses the coincidence degree for the color discrimination to represent color information, which is normally represented by three parameters, by one parameter as the coincidence degree. Hence this photoelectric switch can be handled in a similar manner to the light receiving amount-type photoelectric switch that performs color discrimination by use of a light receiving amount and a threshold, and the setting can be simply made. Meanwhile, in the case of detecting a label pasted on the workpiece, a component assembled to the workpiece, or the like, the conventional photoelectric switch obtains a color difference from the reference color, and determines that the label or the assembled component exists when the color difference is not lower than a certain level. Also in the case of detecting a register mark representing a cut position of a sheet-like member, a label pasted position, or the like, it is determined that the register mark exists when the color difference from the reference color is not lower than a certain level. The color difference is obtained from the coincidence degree and its upper limit. When color information is completely coincident with the reference color, the color difference is 0.

In the conventional photoelectric switch, as described above, a color difference from a previously registered reference color is compared with a threshold for determination, to discriminate the presence or absence of a label or the like. Thus, when color combination of the workpiece surface has changed from color combination at the time of registering the reference color, the detection accuracy deteriorates, which has been problematic. For example, the color combination of the workpiece surface changes due to color fade-out or variation among manufacturing lots. Further, the color combination of the workpiece surface changes due to attachment of contamination. Moreover, it is considered that, when a distance to the workpiece varies due to flapping or waving of a carrier device, the color combination changes by an influence of chromatic aberration of an optical system. Such a change in color combination undesirably leads to occurrence of erroneous detection.

SUMMARY OF THE INVENTION

The present invention has been made in view of the above circumstances. It is an object of the present invention to provide a photoelectric switch that prevents erroneous detection to improve detection accuracy. In particular, it is an object to provide a photoelectric switch that can prevent erroneous detection due to color fade-out of a workpiece, variation in color combination among manufacturing lots of workpieces, contamination on the optical surface of the photoelectric switch, or flapping of a carrier device.

According to one embodiment of the invention, a photoelectric switch includes: a first light projecting unit for projecting a first detected light corresponding to two or more specific wavelengths toward a first detection area; a second light projecting unit for projecting a second detected light corresponding to the two or more specific wavelengths toward a second detection area; a light receiving unit for receiving a reflected light from the first detection area to generate a first light reception signal, and receiving a reflected light from the second detection area to generate a second light reception signal; a casing for accommodating the first light projecting unit, the second light projecting unit, and the light receiving unit; and a detection signal generating unit for performing workpiece determination based on at least one of the specific wavelength components of the first light reception signal and the second light reception signal, to generate a detection signal on the basis of a result of the workpiece determination.

With such a configuration, since the workpiece determination is performed based on the first light reception signal and the second light reception signal acquired by making the first light projecting unit and the second light projecting unit project detected lights, it is possible to improve the detection accuracy as compared with the case of performing the workpiece determination by use of just one of the first light reception signal and the second light reception signal.

In addition to the above configuration, a photoelectric switch according to another embodiment of the invention includes a color information acquiring unit for comparing light receiving amounts of at least two of the specific wavelengths based on the first light reception signal to acquire first color information, and comparing light receiving amounts of at least two of the specific wavelengths based on the second light reception signal to acquire second color information. It is configured such that the detection signal generating unit performs workpiece determination based on the first color information and the second color information.

With such a configuration, since the workpiece determination is performed based on the color information acquired by comparing the light receiving amounts of at least two of the specific wavelengths, it is possible to reduce erroneous detection due to variation in reflectance of the workpiece surface, variation in distance to the workpiece, or variation in tilt of the workpiece surface.

In addition to the above configurations, a photoelectric switch according to still another embodiment of the invention includes a coincidence degree calculating unit for obtaining a coincidence degree of the first color information and the second color information. It is configured such that the detection signal generating unit compares the coincidence degree with a previously defined determination threshold to perform workpiece determination.

With such a configuration, since a difference in color combination between the first detection area and the second detection area is detected, at the time of detecting a label, an assembled component, a register mark, or the like on the workpiece, it is possible to reduce influences by color fade-out of the workpiece, variation in color combination among manufacturing lots of workpieces, contamination on the optical surface of the photoelectric switch, and flapping of the carrier device. Further, since the coincidence degree is obtained from the first color information and the second color information, there is no need to register a reference color in advance of the workpiece determination.

In addition to the above configurations, a photoelectric switch according to still another embodiment of the invention includes a capture instruction accepting unit for accepting an instruction to capture color information for correction; and a corrected amount calculating unit for obtaining a corrected amount for adjusting a zero point of a color difference based on the acquired first color information and second color information in accordance with the capture instruction. It is configured such that the detection signal generating unit is configured so as to perform workpiece determination based on the first color information and the second color information after corrected by use of the corrected amount.

With such a configuration, even when the color combination of the light source changes between the first light projecting unit and the second light projecting unit, or even when there is variation in characteristics between the light receiving element that receives a reflected light from the first detection area and the light receiving element that receives a reflected light from the second detection area, the zero point of the color difference is adjusted, thus enabling prevention of deterioration in detection accuracy.

In addition to the above configurations, a photoelectric switch according to still another embodiment of the invention includes: a capture instruction accepting unit for accepting a capture instruction of a reference color; a reference color storing unit for storing first color information and second color information acquired in accordance with the capture instruction respectively as a first reference color and a second reference color; and a coincidence degree calculating unit for comparing the first color information with the first reference color to obtain a first coincidence degree, and comparing the second color information with the second reference color to obtain a second coincidence degree. It is configured such that the detection signal generating unit performs workpiece determination based on the first coincidence degree and the second coincidence degree.

With such a configuration, color discrimination on the first detection area and color discrimination on the second detection area can be combined to perform the workpiece determination. Hence a region or the like on the workpiece which has a predetermined color difference between the first detection area and the second detection area can be detected.

In addition to the above configurations, a photoelectric switch according to still another embodiment of the invention is configured such that the first detected light and the second detected light are white lights each containing two or more color components with different hues, the light receiving unit has two or more light receiving elements for each selectively receiving a reflected light from the detection area in association with the two or more specific wavelengths, and the detection signal generating unit performs workpiece determination based on at least one of the color components of a first light receiving amount and a second light receiving amount respectively corresponding to a reflected light from the first detection area and a reflected light from the second detection area.

With such a configuration, the workpiece determination is performed based on at least one color component of the light receiving amount, and hence it is possible to detect a label, an assembled component, a register mark, and the like on the workpiece through use of variation in light receiving amount due to a difference in reflectance or color of the workpiece surface, a difference in distance to the workpiece, a difference in tilt of the workpiece surface, or the like.

The photoelectric switch according to the present invention can prevent erroneous detection to improve the detection accuracy. In particular, the workpiece determination is performed based on the first light reception signal and the second light reception signal acquired by making the first light projecting unit and the second light projecting unit project detected lights, whereby it is possible to prevent erroneous detection due to color fade-out of a workpiece, variation in color combination among manufacturing lots of workpieces, contamination on the optical surface of the photoelectric switch, or flapping of the carrier device.

BRIEF DESCRIPTION OF THE DRAWINGS

FIG. 2 is a sectional view of the photoelectric switch of FIGS. 1A and 1B along a cutting line A-A;

FIGS. 7A and 7B are explanatory views showing one example of an operating form of the photoelectric switch of FIGS. 1A and 1B;

DETAILED DESCRIPTION OF PREFERRED EMBODIMENT

Hereinafter, an embodiment of the present invention will be described with reference to the drawings. In the present specification, a description will be given taking a direction of a light axis (main axis) of a light projecting lens as a longitudinal direction for the sake of convenience. However, this does not restrict the position of the photoelectric switch according to the present invention when used.

<Photoelectric Switch 1>

Figure 1A:
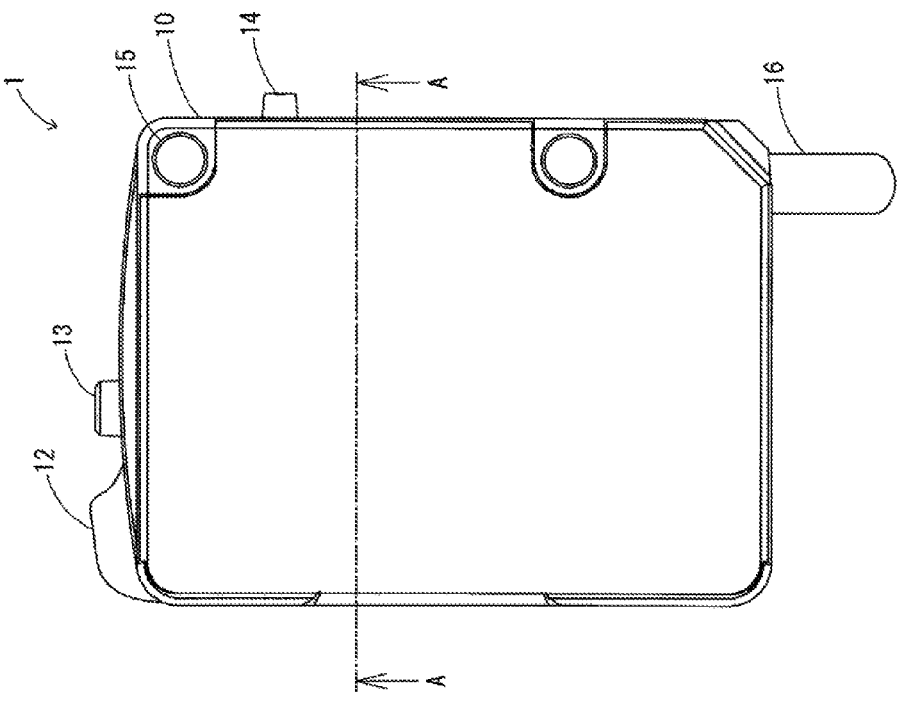
FIGS. 1A and 1B are plan views showing one configuration example of a photoelectric switch according to an embodiment of the present invention.
Figure 1B:
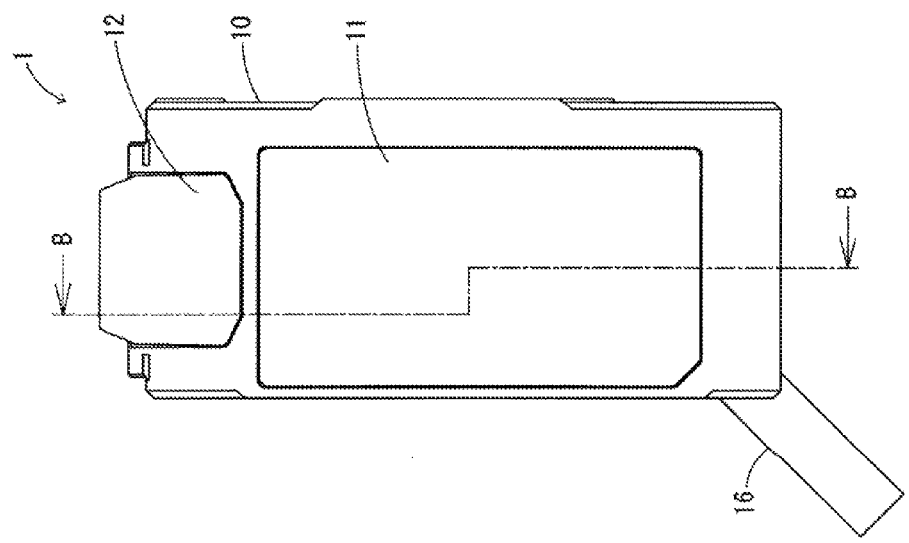
Figure 3:
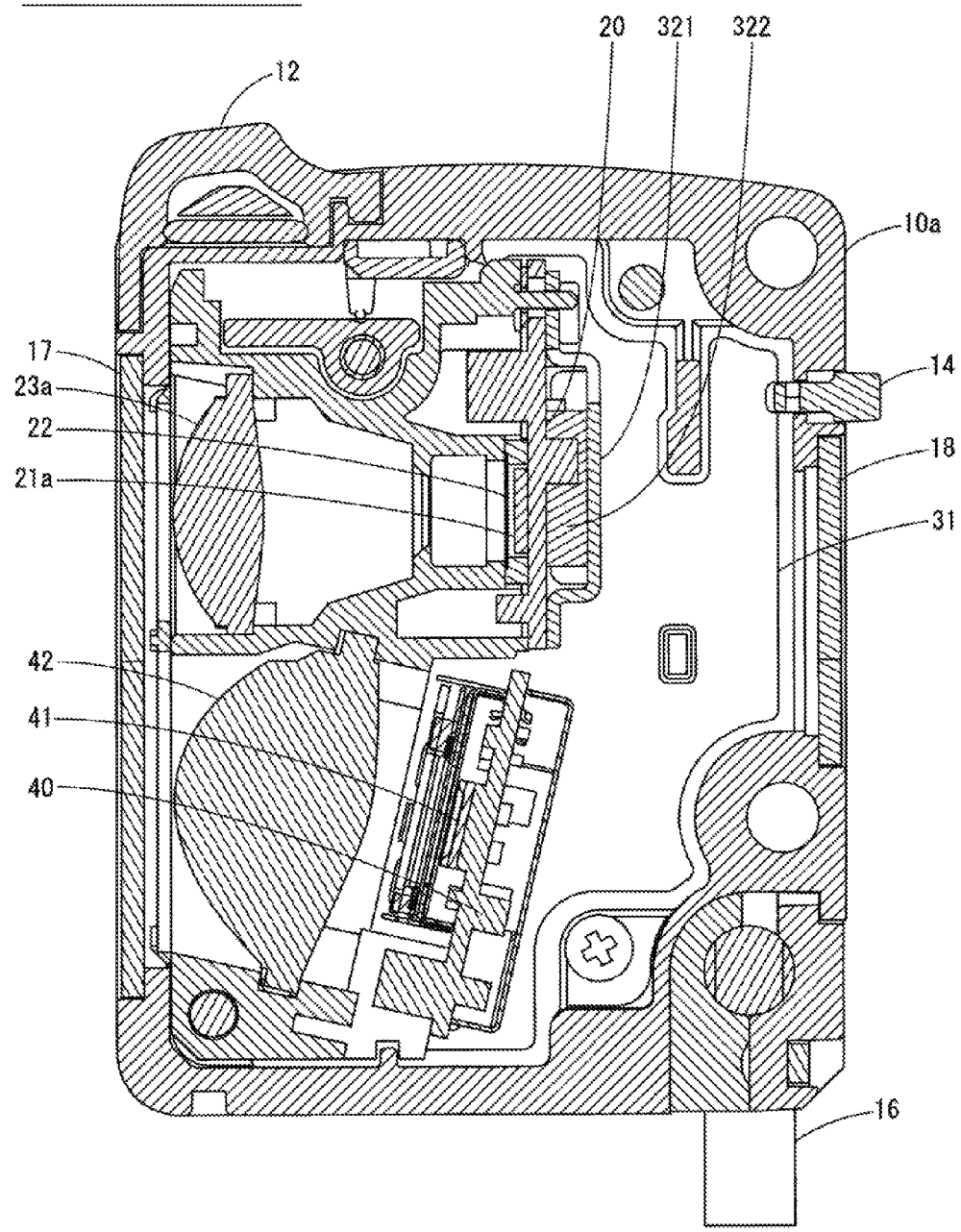
FIG. 3 is a sectional view of the photoelectric switch of FIGS. 1A and 1B along a cutting line B-B.
Figure 4:
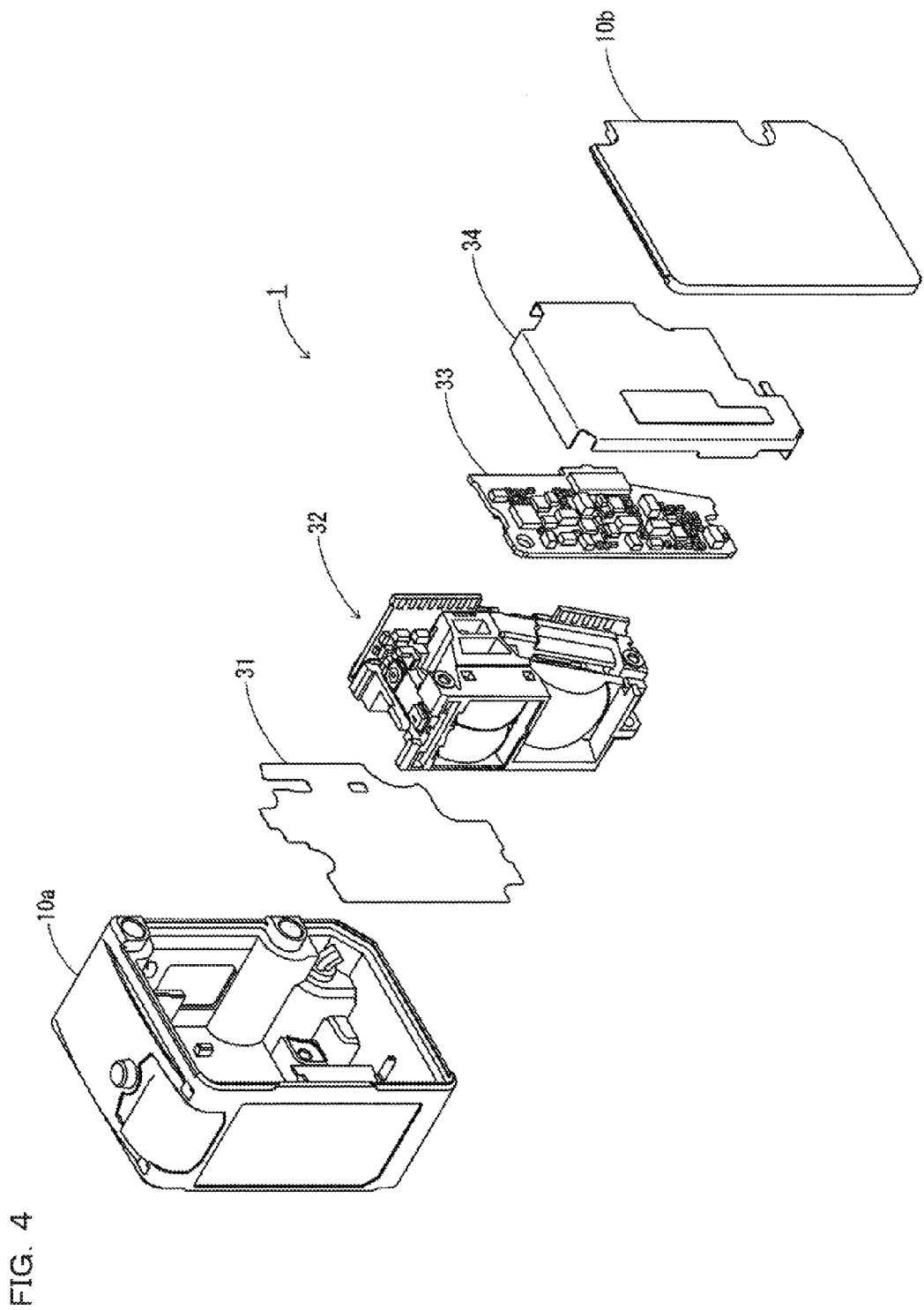
FIG. 4 is a perspective view showing the photoelectric switch of FIGS. 1A and 1B in a developed fashion.
Figure 5:
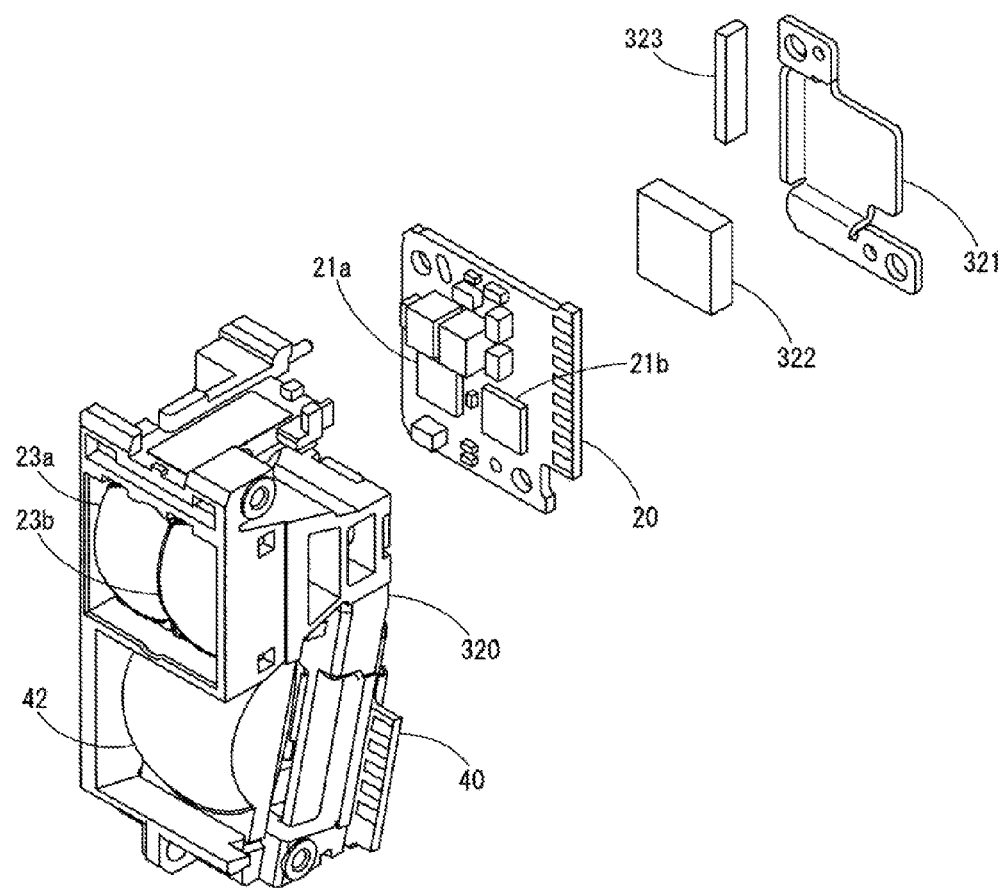
FIG. 5 is a perspective view showing an optical module of FIG. 4 in a developed fashion.

FIGS. 1A and 1B are plan views showing one configuration example of a photoelectric switch 1 according to an embodiment of the present invention, and shows a color discrimination-type photoelectric switch 1. FIG. 1A shows the front surface of a casing 10, and FIG. 1B shows the right lateral surface of the casing 10. FIG. 2 is a sectional view showing the cut surface in the case of cutting the photoelectric switch 1 of FIGS. 1A and 1B along a cutting line A-A. FIG. 3 is a sectional view showing a cut surface in the case of cutting the photoelectric switch 1 of FIGS. 1A and 1B along a cutting line B-B. FIGS. 2 and 3 show the case of seeing the cut surface from directions indicated by arrows. FIG. 4 is a perspective view showing the photoelectric switch 1 of FIGS. 1A and 1B in a developed fashion. FIG. 5 is a perspective view showing an optical module 32 of FIG. 4 in a developed fashion.

The photoelectric switch 1 is a detector that projects a detected light and receives a reflected light from a detection area to perform workpiece determination, and then generates a detection signal based on the result of the workpiece determination. The workpiece determination is performed by discriminating a color of the workpiece surface, and the detection signal indicating the quality of the workpiece, the presence or absence of the workpiece, or the like, is outputted.

This photoelectric switch 1 is configured of a casing 10, an insulating film 31, an optical module 32, a main substrate 33, and a shield sheet 34. The casing 10 is a casing in a rectangular shape for accommodating a circuit element, optical components, and the like, and is made up of a casing body 10a and a body cover 10b.

The casing body 10a is a box body with its right lateral surface opened, and accommodates the insulating film 31, the optical module 32, the main substrate 33, and the shield sheet 34 in this order. The body cover 10b is a side plate for blocking the opening of the casing body 10a, and fitted to the casing body 10a. The casing body 10a and the body cover 10b are formed of a high thermally conductive material. The high thermally conductive material is a material having high thermal conductivity, and is excellent in heat dissipation properties.

For example, the casing body 10a and the body cover 10b are formed using a metal which has a high thermal conductance rate as compared to that of resin or the like. In this photoelectric switch 1, the casing 10 made of zinc die-cast is used. The casing body 10a is provided with a light projecting/receiving window 11, a display lamp 12, operation keys 13, 14, a fitting hole 15, a leader section of a wire cable 16, and the display panel 18.

The detected light is emitted from the light projecting/receiving window 11 provided on the front surface of the casing body 10a, and the reflected light from the detection area is incident on the light projecting/receiving window 11. The light projecting/receiving window 11 is a rectangular opening formed in the casing body 10a, and fitted with a protection cover 17 made of a transparent plate for closing the opening.

The display lamp 12 is an LED (Light Emitting Diode) indicator which is lighted in accordance with the result of the workpiece determination, and is disposed at the front end of the upper surface of the casing body 10a. The operation key 13 is a press-type set key that is used at the time of specifying a reference color for workpiece determination, and is disposed on the upper surface of the casing body 10a.

The operation key 14 is a press-type direction key that is used at the time of specifying a threshold for workpiece determination, and is made up of an up-key and a down-key. A numerical value can be incremented by operating the up-key, and a numerical value can be decremented by operating the down-key. The operation key 14 is disposed on the rear surface of the casing body 10a.

The fitting hole 15 is a screw hole for fixing the photoelectric switch 1 to factory facilities and buildings, and provided on the right lateral surface of the casing body 10a. The wire cable 16 is configured of a power supply cable for supplying power to the circuit element in the casing 10, and a signal cable for transmitting a controlling signal and a detection signal. This leader section of the wire cable 16 is disposed at a corner formed of three surfaces, which are the rear surface, the bottom surface (lower surface), and the left lateral surface, of the casing body 10a.

The display panel 18 is a display device for displaying a threshold for workpiece determination and a coincidence degree, and is disposed on the rear surface of the casing body 10a. For example, the display panel 18 is a seven-segment display. Note that an active matrix drive-type display device such as an LCD (Liquid Crystal Display) may be used for the display panel 18.

The insulating film 31 has electric insulating properties, and is a sheet-like shield member disposed along the side wall of the casing body 10a. This insulating film 31 is a resin-made film electrically insulating the circuit element from the casing 10, and disposed so as to adhere to the left side wall.

While it is preferable that the insulating film 31 have high thermal conductivity, when the thickness of the film is lower than about 0.5 mm, the heat resistance is low enough without particularly considering the thermal conductivity. More preferably, when the thickness is about 0.1 mm, the heat can be dissipated to the casing 10 via the insulating film 31. Note that both the heat dissipation properties and the electric insulating properties can be achieved by interposing an insulating material with high thermal conductivity and insulating properties in place of the insulating film 31.

<Optical Module 32>

The optical module 32 is configured of a light projecting substrate 20, light emitting elements 21a, 21b, a slit 22, light projecting lens 23a, 23b, a light receiving substrate 40, a PD unit 41, a light receiving lens 42, an optical base frame 320, a heat sink 321, a spacer 322, and a thermally conductive member 323. The optical base frame 320 is a support member that supports the optical components and the circuit board.

The light emitting elements 21a, 21b are light sources for light projection that generate detected lights. Each of the light emitting elements 21a, 21b is an LED (Light Emitting Diode) for each generating, as the detected light, a white light containing two or more color components with different hues, and is made of a rectangular semiconductor chip and mounted on the surface of the light projecting substrate 20. The light emitting elements 21a, 21b are arrayed in a horizontal direction, and fixed to the light projecting substrate 20 with a space formed therebetween. The light projecting substrate 20 is a circuit board provided with a circuit element for light projection. This light projecting substrate 20 is fixed to the optical base frame 320, with the light emitting surfaces of the light emitting elements 21a, 21b facing forward.

The heat sink 321 is a heat sink member for dissipating the heat generated in the circuit element such as the light emitting elements 21a, 21b, and is formed of a high thermally conductive material. For example, the heat sink 321 is configured of a metal plate made of aluminum. This heat sink 321 is disposed so as to face the rear surface of the light projecting substrate 20. Note that the heat sink 321 is not restricted to a metal plate so long as being a member with high thermal conductivity, and may be formed of thermally conductive resin, for example. The light projecting substrate 20 is formed with a through hole in a position corresponding to a fitting hole that is formed in the heat sink 321. The heat sink 321 is fixed to the optical base frame 320, with the light projecting substrate 20 sandwiched therebetween and with the spacer 322 sandwiched between the heat sink 321 and the light projecting substrate 20.

The spacer 322 is a platy thermally conductive member which is made of high thermally conductive resin having electric insulating properties and is in contact with the rear surface of the light projecting substrate 20 and the front surface of the heat sink 321. The spacer 322 is preferably formed of a member having high adhesive followability to the uneven surface and the bent surface of rubber, elastomer, a gel-like body, and the like. The spacer 322 adheres to the rear surface of the light projecting substrate 20 and the front surface of the heat sink 321, to achieve high heat dissipation properties. For example, the spacer 322 is made of silicone rubber, acrylic resin rubber, elastomer, or a gel-like body, having electric insulating properties and thermal conductivity.

The thermally conductive member 323 is a block-like member made of high thermally conductive resin, and disposed between the side wall of the casing body 10a and the heat sink 321. This thermally conductive member 323 is made up of a flat plate extending in a vertical direction. For example, the spacer 322 and the thermally conductive member 323 are formed of silicone rubber. When the heat sink 321 is made of a metal, the thermally conductive member 323 preferably has electric insulating properties. When the insulating film 31 is not to be provided, the thermally conductive member 323 preferably has electric insulating properties.

The thermally conductive member 323 is preferably formed of a member having high adhesive followability to the uneven surface and the bent surface of rubber, elastomer, a gel-like body, or the like. The thermally conductive member 323 adheres to the insulating film 31 disposed on the side wall of the casing body 10a and to the heat sink 321, to achieve high heat dissipation properties. For example, the thermally conductive member 323 is made of silicone rubber, acrylic resin rubber, elastomer, or a gel-like body, having electric insulating properties and thermal conductivity. When the insulating film 31 is not to be provided, the thermally conductive member 323 adheres to the side wall of the casing body 10a and the heat sink 321.

The slit 22 is a platy optical component having openings smaller than the light emitting surfaces of the light emitting elements 21a, 21b, and is disposed such that the openings face the light emitting surfaces of the light emitting elements 21a, 21b. This slit 22 is made up of a metal plate formed with through hole at a position facing the light emitting element 21a and a through hole at a position facing the light emitting element 21b. The plate surface is subjected to blackening, or the plate surface is formed with a black coated film. The slit 22 preferably has the plate surface subjected to matte blackening, or the plate surface formed with a matte black coated film. In this slit 22, the opening is made up of a through hole. For example, the slit 22 is formed of stainless steel. The opening of the slit 22 has a circular or rectangular shape. The slit 22 is fixed to the optical base frame 320.

Each of the light projecting lenses 23a, 23b is an optical component for concentrating a detected light, having passed through the opening of the slit 22, on the detection area, and is fixed to the optical base frame 320. The light emitting element 21a, the slit 22, and the light projecting lens 23a are a first light projecting unit for projecting a first detected light corresponding to two or more specific wavelengths toward a first detection area, by turning on the light emitting element 21a that generates a detected light made up of a white light. The light emitting element 21b, the slit 22, and the light projecting lens 23b are a second light projecting unit for projecting a second detected light corresponding to two or more specific wavelengths, which is the same as the first detected light, toward a second detection area, by turning on the light emitting element 21b that generates a detected light made up of a white light. The specific wavelength is a color component for use in color discrimination.

A light axis of the light projecting lens 23a and a light axis of the light projecting lens 23b are substantially parallel to each other. Further, a light projection space between the light projecting lenses 23a, 23b and the slit 22 is partitioned by a partition wall 24 provided in the optical base frame 320. With the first light projecting unit and the second light projecting unit accommodated in the common casing 10, the photoelectric switch 1 is easily installed.

The PD unit 41 is a light receiving element unit that selectively receives the reflected light from the detection area in association with two or more specific wavelengths, and generates two or more light reception signals respectively corresponding to light receiving amounts of the respective specific wavelengths. The PD unit 41 is made up of two or more PDs (Photo Diodes). This PD unit 41 is a multi-divisional PD unit where PDs are two-dimensionally arrayed on the light receiving substrate 40. For example, the PDs are arrayed in a 12×24-matrix form.

The light receiving substrate 40 is a circuit board provided with a circuit element for light reception. This light receiving substrate 40 is fixed to the optical base frame 320, with the light receiving surface of the PD unit 41 facing forward. The light receiving lens 42 is an optical component that forms an image of the reflected light, from the detection area, on the light receiving surface of the PD unit 41. This light receiving lens 42 is disposed with its light axis tilted upward so as to intersect with the light axes of the light projecting lens 23a, 23b. The optical components and the circuit element for light reception are disposed on the closer side to the bottom than the optical components and the circuit element for light projection.

The foregoing insulating film 31 is disposed between the casing body 10a and the optical module 32. The thermally conductive member 323 is disposed in a contact state with the insulating film 31 and the heat sink 321.

The main substrate 33 is a circuit board provided with a circuit element such as an arithmetic circuit. This main substrate 33 is fitted to the optical base frame 320, with the circuit formation surface facing the body cover 10b side. Only one surface of the main substrate 33 may be the circuit formation surface, or both surfaces thereof may be the circuit formation surfaces.

The shield sheet 34 is a sheet-like shield member having electrostatic, magnetic, or electromagnetic shielding performance. This shield sheet 34 is a sheet for insulating the circuit element in the casing 10 in an electrostatic, magnetic, or electromagnetic manner. The shield sheet 34 is disposed between the main substrate 33 and the body cover 10b. The shield sheet 34 may be covered with a resin-made film having electric insulating properties.

Figure 6A:
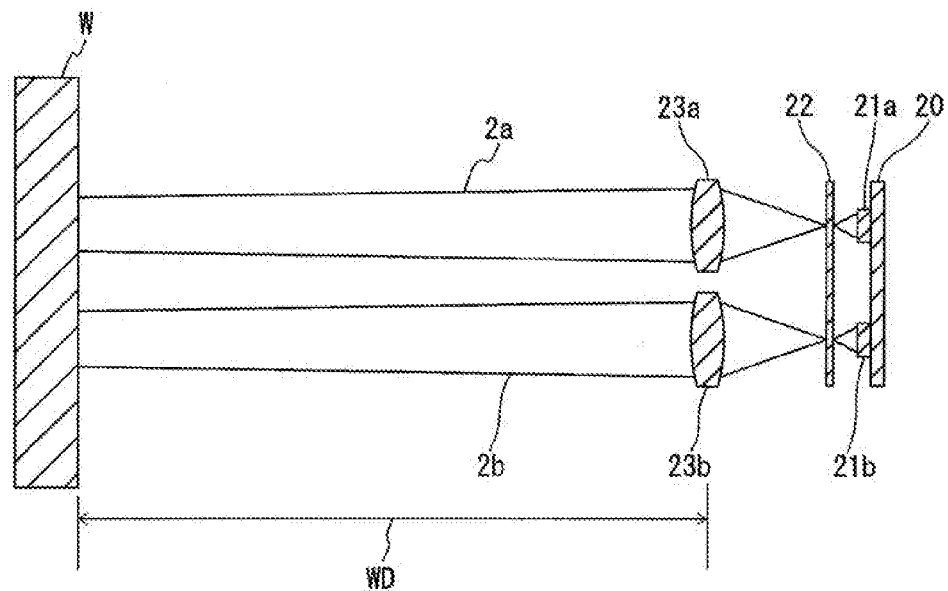
FIGS. 6A and 6B are explanatory views schematically showing one example of operation of the photoelectric switch of FIGS. 1A and 1B.
Figure 6B:
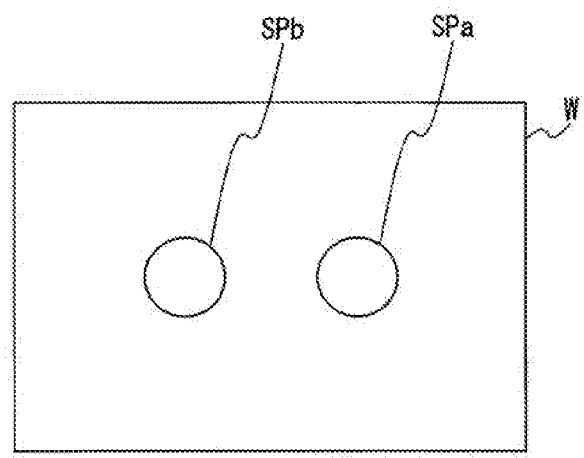

FIGS. 6A and 6B are explanatory views schematically showing one example of operation of the photoelectric switch 1 of FIGS. 1A and 1B. FIG. 6A shows a state where the light projecting optical system for projecting detected lights 2a, 2b toward the workpiece W is seen from above. FIG. 6B shows the light projection spots SPa, SPb formed on the workpiece W.

The light emitting elements 21a, 21b are white LEDs for mixing lights of two or more colors that are complementary to each other to generate a white light. For example, the light emitting elements 21a, 21b are each made up of a laminate formed by laminating a semiconductor element layer for emitting a blue light and a fluorescent layer having a fluorescent body.

In the fluorescent layer, the fluorescent body is fixed by translucent resin or glass. The fluorescent body is excited by emitted light of the semiconductor element layer, and emits a light such as a yellow light, which has a longer wavelength than that of a blue light.

Each of the detected lights 2a, 2b is a mixed light obtained by mixing a blue light and a yellow light, and contains color components with three specific wavelengths of red, green, and blue. For example, spectrums of the detected lights 2a, 2b are coincident, and light amounts thereof are also at the same level. Note that the spectrums of the detected lights 2a, 2b are not necessarily required to be made coincident with each other. For example, the photoelectric switch 1 may be configured so as to have a spectrum correcting unit that previously measures a difference in spectrum between the detected lights 2a and 2b, stores the measurement result as correction information, and corrects the non-coincidence of the spectrums by use of the correction information at the time of acquiring color information. Further, the light amounts of the detected lights 2a, 2b are not necessarily required to be made coincident with each other. For example, the photoelectric switch 1 may be configured so as to have a light amount correcting unit that previously measures a difference in light amount between the detected lights 2a and 2b, stores the measurement result as correction information, and corrects the non-coincidence of the light amounts by use of the correction information at the time of acquiring color information.

The slit 22 is disposed between the light emitting elements 21a, 21b and the light projecting lenses 23a, 23b. For example, the slit 22 is disposed in the vicinities of the light emitting elements 21a, 21b. Out of the detected lights emitted from the light emitting surfaces of the light emitting elements 21a, 21b, a light from the periphery of each of the light emitting elements 21a, 21b is blocked by the slit 22. The detected lights having passed through the openings of the slit 22 are subject to the refractive function by the light projecting lenses 23a, 23b, and images of the lights are formed in the detection area including the workpiece W as light projection spots SPa, SPb. The slit 22 does not reduce a light amount but forms images of the slit section as the light projection spots SPa, SPb, to thereby obtain sharply defined spots without light amount irregularity or color irregularity.

The light projection spot SPa is an image of the slit 22 formed by the light projecting lens 23a in association with the detected light 2a. Meanwhile, the light projection spot SPb is an image of the slit 22 formed by the light projecting lens 23b in association with the detected light 2b.

The light axis of the light emitting element 21a, the slit 22, and the light projecting lens 23a is substantially parallel to the light axis of the light emitting element 21b, the slit 22, and the light projecting lens 23b. In the vicinities of focal positions of the light projecting lenses 23a, 23b, the light projection spots SPa, SPb do not overlap with each other, but are separated from each other. Accordingly, in the vicinities of focal positions of the light projecting lenses 23a, 23b, even when a distance WD to the workpiece W varies, a change in position of each of the light projection spots SPa, SPb and a change in space therebetween are sufficiently small.

Especially when the light projection spots SPa, SPb are to be formed close to each other, a difference in color combination is small. Hence at the time of detecting a label, an assembled component, a register mark RM, or the like on the workpiece W, it is possible to reduce influences by color fade-out of the workpiece W, variation in color combination among manufacturing lots of workpieces W, adherence of contamination to the workpiece surface, and flapping of the carrier device.

FIGS. 7A and 7B are explanatory views showing one example of an operating form of the photoelectric switch 1 of FIGS. 1A and 1B. The figures show a case where the workpiece W is a sheet-like member that is carried in a direction of its long side, and the register mark RM printed on the workpiece W is to be detected. The figures illustrate the workpiece W being carried in the vertical direction of the plane of the paper.

FIG. 7A shows a state where the one light projection spot SP positioned in a passage area of the register mark RM is formed at a position where the register mark RM is not present. In this case, the photoelectric switch 1 is in an off-state. On the other hand, FIG. 7B shows a state where the register mark RM is passing immediately below the light projection spot SP. In this case, the photoelectric switch 1 is in an on-state.

The one light projection spot SP is disposed in the passage area of the register mark RM, and the other light projection spot SP is disposed in a non-passage area of the register mark RM. The register mark RM is detected by analyzing each of light reception results at the time of sequentially forming the light projection spots SP and determining whether or not a color difference between color information of a reflected light from the one light projection spot and color information of a reflected light from the other light projection spot is not lower than a certain level.

In the conventional photoelectric switch, since color information is compared with a previously registered reference color to determine the presence or absence of the register mark RM, when the color combination of the workpiece surface has changed from the color combination at the time of registering the reference color, the detection accuracy deteriorates, which has been problematic.

In contrast, in the present embodiment, since color information corresponding to the passage area of the register mark RM is compared with color information corresponding to the non-passage area to determine the presence or absence of the register mark RM, the detection is less susceptible to the change in color combination of the workpiece surface. That is, when there is a sufficient color difference between the light projection spots SPa and SPb, it is possible to accurately detect the register mark RM without being affected by color fade-out of the workpiece W, variation in color combination among manufacturing lots of workpieces W, adherence of contamination to the workpiece surface, flapping of the carrier device, or the like.

Figure 8:
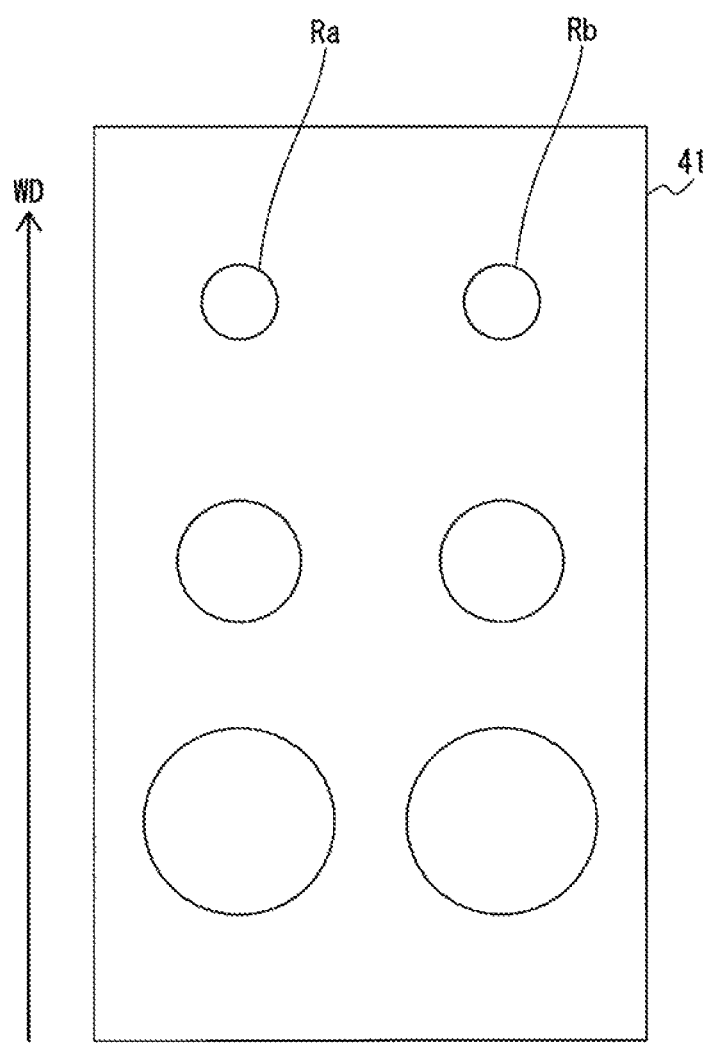
FIG. 8 is a view showing the light receiving surface of a PD unit of FIG. 3.

FIG. 8 is a view showing the light receiving surface of the PD unit 41 of FIG. 3. The figure schematically shows light reception spots Ra, Rb formed on the light receiving surface. The figure illustrates the light reception spots Ra, Rb in the case of a distance WD being changed in three stages.

The light receiving surface of the PD unit 41 has a rectangular shape with long sides in the vertical direction. The light reception spot Ra corresponds to a reflected light 3 of the detected light 2a reflected by the workpiece W, and is an image of the light projection spot SPa formed by the light receiving lens 42. This light reception spot Ra is formed on the left side of the light receiving surface. Meanwhile, the light reception spot Rb corresponds to the reflected light 3 of the detected light 2b reflected by the workpiece W, and is an image of the light projection spot SPb formed by the light receiving lens 42. This light reception spot Rb is formed on the right side of the light receiving surface.

The light reception spots Ra, Rb are formed at positions corresponding to the distance WD. In this example, the longer the distance WD, the closer to the top of the light receiving surface the light reception spots Ra, Rb are formed. Moreover, the longer the distance WD, the smaller the diameters of the light reception spots Ra, Rb become. Note that in this example, the light reception spots Ra, Rb are formed so as to be held within the light receiving surface of the PD unit 41 regardless of the distance WD. However, when the distance WD is short, the light reception spots Ra, Rb may be formed so as to be located partially off the light receiving surface. With such a configuration, the variation in light receiving amount due to the change in distance WD is reduced.

Figure 9:
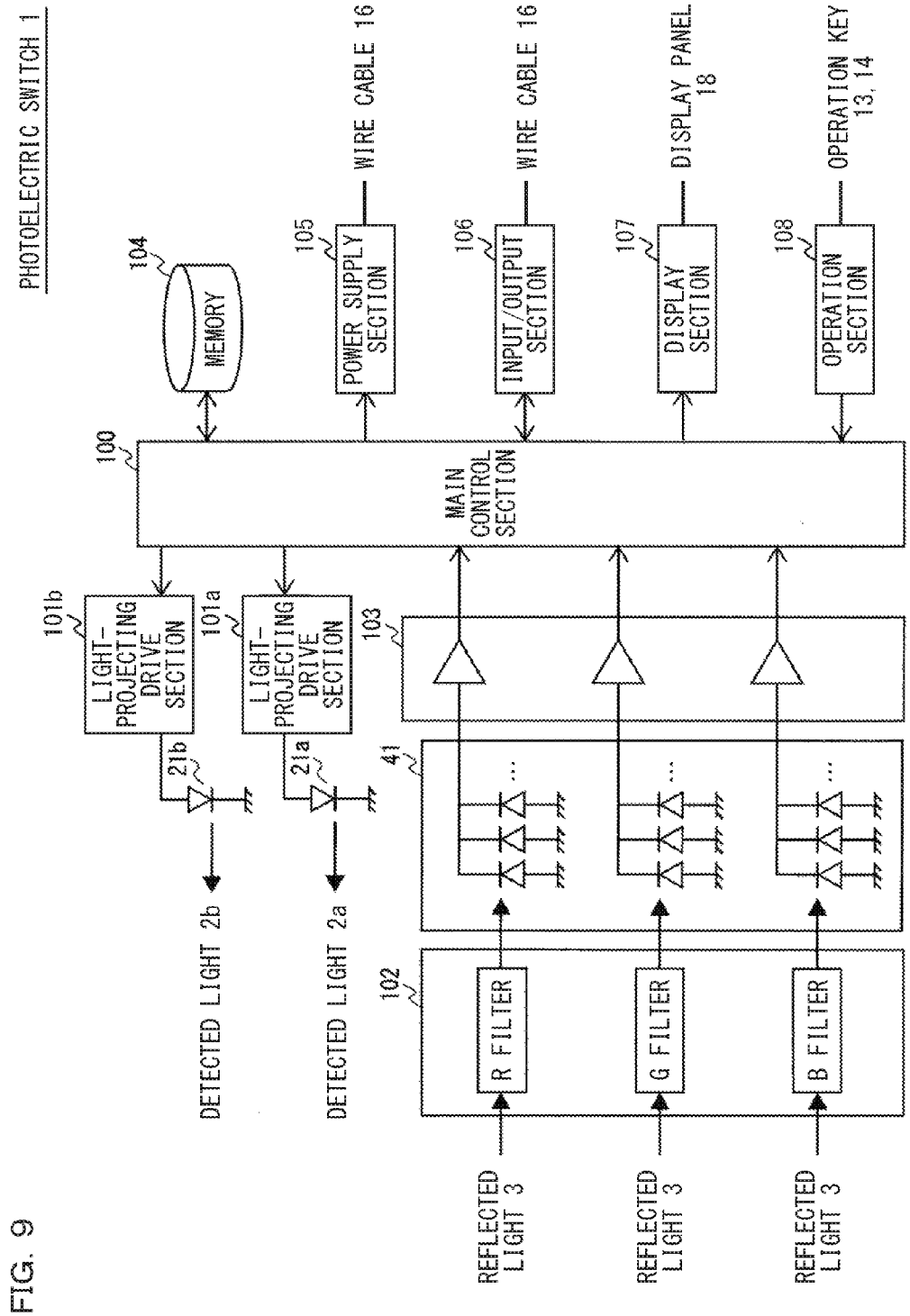
FIG. 9 is a block diagram showing one example of a functional configuration in the photoelectric switch of FIGS. 1A and 1B.

FIG. 9 is a block diagram showing one example of a functional configuration in the photoelectric switch 1 of FIGS. 1A and 1B. This photoelectric switch 1 is made up of a main control section 100, light projection driving sections 101a, 101b, the light emitting elements 21a, 21b, a color filter 102, the PD unit 41, an amplification section 103, a memory 104, a power supply section 105, an input/output section 106, a display section 107, and an operation section 108.

The main control section 100 controls projected/received lights, and performs the workpiece determination based on a light reception signal. The light projection driving sections 101a, 101b respectively drive the light emitting elements 21a, 21b based on an instruction of the main control section 100. For example, the main control section 100 controls a light projecting amount to be instructed to each of the light projection driving sections 101a, 101b. The light projecting amount is controlled based on an amount of a light received from the light receiving element such that the light receiving amount is held within a certain range.

In the case of a workpiece with a high reflectance, since the light receiving amount is relatively large, the main control section 100 instructs a relatively small light projecting amount to each of the light projection driving sections 101a, 101b based on the light receiving amount. On the other hand, in the case of a workpiece with a low reflectance, since the light receiving amount is relatively small, the main control section 100 instructs a relatively large light projecting amount to each of the light projection driving sections 101a, 101b based on the light receiving amount. Further, the light projection driving sections 101a, 101b pulse-drive the light emitting elements 21a, 21b based on the light projecting amount instruction and the light projection timing instruction made by the main control section 100. When the light emitting elements 21a, 21b are to be pulse-driven, pulse light emitting amounts of the light emitting elements 21a, 21b may be measured by a monitor PD, not shown, and the light projection driving sections 101a, 101b may be controlled such that the measured pulse light emitting amounts are coincident with predetermined target values. In this case, the main control section 100 can adjust the light emitting amounts of the light emitting elements 21a, 21b by adjusting the target values. Further, the main control section 100 alternately repeatedly turns on the light emitting elements 21a, 21b.

The detected lights 2a, 2b are emitted toward the detection area respectively via the light projecting lenses 23a, 23b. The reflected light 3 from the detection area is incident on the color filter 102 and the PD unit 41 via the light receiving lens 42.

The color filter 102 is an optical component that selectively transmits a light of a color component with a specific wavelength in accordance with a two-dimensional position, and is disposed on the light receiving surface of the PD unit 41. In this color filter 102, an R filter area, a G filter area, and a B filter area, which respectively and selectively transmit three specific wavelengths of red, green, and blue, are arranged in a matrix form. Any of the R filter area, the G filter area, and the B filter area is made up of a minute rectangular area, and formed in association with a large number of light receiving elements (PDs).

The PD unit 41 receives the reflected light 3 from the first detection area to generate a first light reception signal, and receives the reflected light 3 from the second detection area to generate a second light reception signal. The amplification section 103 is an amplifier unit that amplifies a light reception signal input from each light receiving element of the PD unit 41 and outputs the amplified signal to the main control section 100. This amplification section 103 can switch a gain. The light reception signal is amplified for each color component with a specific wavelength and output to the main control section 100. The gain of the amplification section 103 is controlled by the main control section 100 such that the light receiving amount is held within a certain range based on a light reception signal representing an amount of a light received from the light receiving element in a similar manner to adjustment of the light emitting amounts of the light emitting elements 21a, 21b by the main control section 100. The main control section 100 may control both the gain of the amplification section 103 and the light emitting amounts of the light emitting elements 21a, 21b based on the light reception signal.

The memory 104 holds a threshold for workpiece determination, color information of a reference color, and the like. The power supply section 105 is connected to external equipment such as a controller via the wire cable 16, and supplies a direct current to the main control section 100 and the light projection driving sections 101a, 101b based on the control of the main control section 100. The input/output section 106 is connected to the external equipment such as the controller via the wire cable 16. The input/output section 106 receives a controlling signal, outputs the received signal to the main control section 100, and transmits a detection signal input from the main control section 100 to the external equipment.

The display section 107 displays on the display panel 18 a threshold for workpiece determination, a coincidence degree, a color difference, and the like, based on the control of the main control section 100. The operation section 108 generates an operation signal based on press operation on each of the operation keys 13, 14, and outputs the generated signal to the main control section 100.

<Main Control Section 100>

Figure 10:
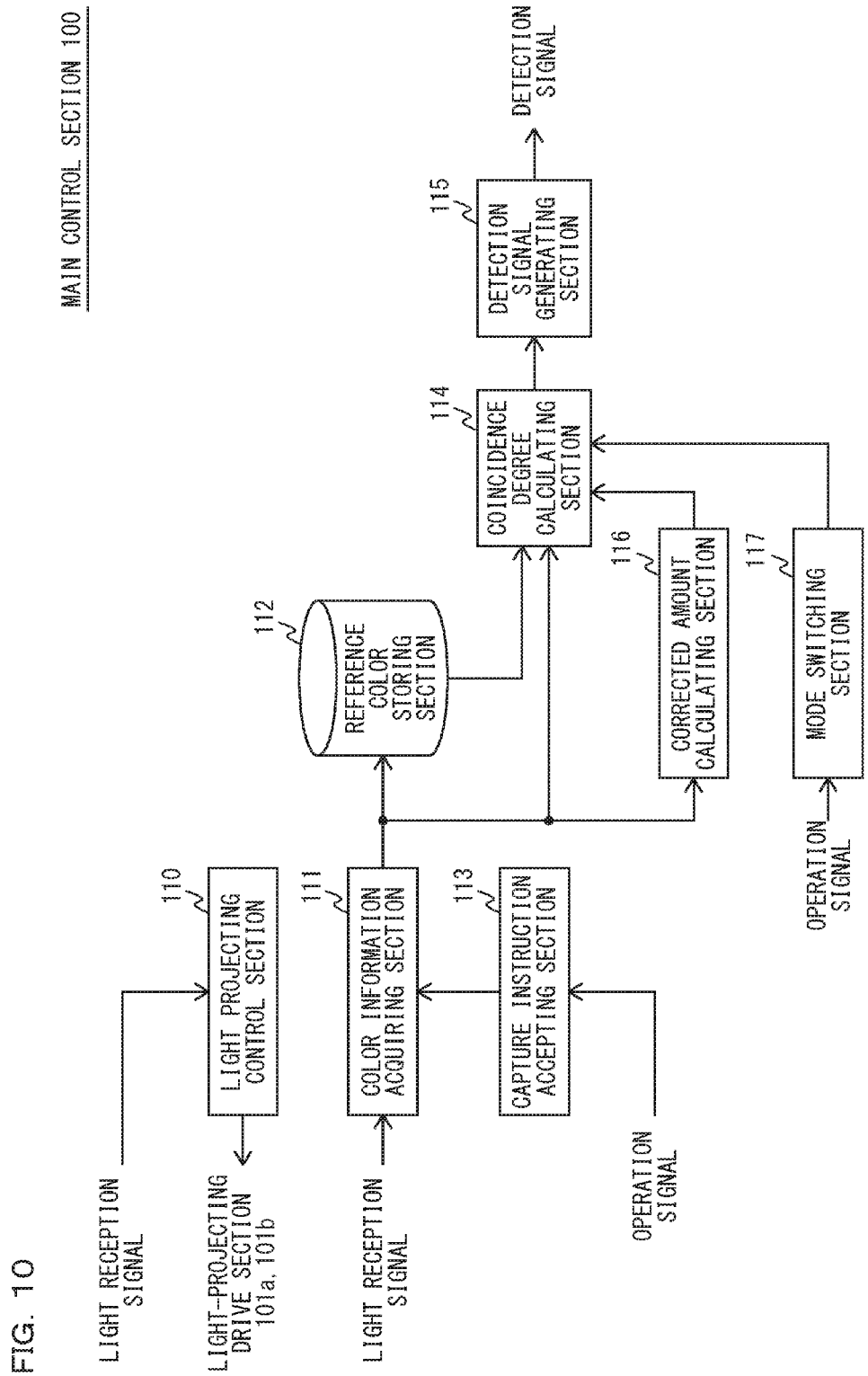
FIG. 10 is a block diagram showing a configuration example of a main control section of FIG. 9.

FIG. 10 is a block diagram showing a configuration example of the main control section 100 of FIG. 9. This main control section 100 is configured of a light projecting control section 110, a color information acquiring section 111, a reference color storing section 112, a capture instruction accepting section 113, a coincidence degree calculating section 114, a detection signal generating section 115, a corrected amount calculating section 116, and a mode switching section 117.

Based on a light reception signal input from the amplification section 103, the light projecting control section 110 controls the light projection driving sections 101a, 101b to adjust amounts of lights projected by the light emitting elements 21a, 21b. For example, in a case where the light receiving amount of the reflected light 3 exceeds a certain level, the following control is performed: the light projecting amount is decreased, and when the light receiving amount of the reflected light 3 falls below a certain level, the light projecting amount is increased to return to its original state.

The light projecting control section 110 switches a gain of the amplification section 103 based on the light reception signal from the amplification section 103. For example, in a case where the light receiving amount of the reflected light 3 exceeds a certain level, the following control is performed: the gain of the amplification section 103 is decreased, and when the light receiving amount of the reflected light 3 falls below a certain level, the gain of the amplification section 103 is increased to return to its original state. Such control of the light projecting amount is performed based on a light receiving amount of any of RGB. Alternatively, it is performed based on a parameter obtained by combining each of the light receiving amounts of RGB. Further, the light projecting control section 110 alternately and repeatedly turns on the light emitting elements 21a, 21b.

Based on two or more light reception signals corresponding to two or more specific wavelengths, the color information acquiring section 111 compares light receiving amounts of at least two specific wavelengths to acquire color information, and stores it into the reference color storing section 112, or outputs it to the coincidence degree calculating section 114, as a reference color. The acquired color information is defined based on light receiving amount levels of the three colors. For example, when it is assumed that the light receiving amount level of red light is $R_1$, the light receiving amount level of green light is $G_1$, the light receiving amount level of blue light is $B_1$, and a sum of the light receiving amount is: $M_k = R_k + G_k + B_k$, a color is represented by a set $(r_1, g_1, b_1)$ by use of a ratio of the light receiving amount levels of the three colors: $r_k = R_k/M_k$, $g_k = G_k/M_k$, $b_k = B_k/M_k$. The color information $(r_1, g_1, b_1)$ is periodically repeatedly acquired.

In this photoelectric switch 1, color information $(r_{1a}, g_{1a}, b_{1a})$ corresponding to the reflected light 3 from the light projection spot SPa, color information $(r_{1b}, g_{1b}, b_{1b})$ corresponding to the reflected light 3 from the light projection spot SPb are alternately and repeatedly acquired. The color information $(r_{1a}, g_{1a}, b_{1a})$ is first color information that is acquired based on a first light reception signal. Meanwhile, the color information $(r_{1b}, g_{1b}, b_{1b})$ is second color information that is acquired based on a second light reception signal.

The capture instruction accepting section 113 accepts a capture instruction for the reference color based on the operation signal from the operation section 108, and instructs the color information acquiring section 111 to capture color information. Based on the instruction by the capture instruction accepting section 113, the color information acquiring section 111 acquires color information $(r_0, g_0, b_0)$ and stores it as color information of the reference color into the reference color storing section 112. The reference color storing section 112 then holds first color information $(r_{0a}, g_{0a}, b_{0a})$ and second color information $(r_{0b}, g_{0b}, b_{0b})$, acquired in accordance with the capture instruction by the capture instruction accepting section 113, respectively as a first reference color and a second reference color.

The coincidence degree calculating section 114 calculates the coincidence degree C. based on color information ($r_{1a}$, $g_{1a}$, $b_{1a}$), ($r_{1b}$, $g_{1b}$, $b_{1b}$) acquired by the color information acquiring section 111, or the color information ($r_0$, $g_0$, $b_0$) of the reference color registered into the reference color storing section 112, and outputs the calculated coincidence degree C. to the detection signal generating section 115. The coincidence degree C. is a parameter indicating a coincidence degree of colors, to quantitatively evaluate how much a color to be compared is similar to the color registered as the reference for the workpiece determination.

For example, the coincidence degree C. is represented by an integer not smaller than 0 and not larger than 999. In this case, the upper limit of the coincidence degree C. is 999, and when the color to be compared is completely coincident with the reference color, the coincidence degree C. is 999. Note that the coincidence degree C. may be represented by an integer not smaller than 1 and not larger than 1000. In this case, the upper limit of the coincidence degree C. is 1000, and when the color to be compared is completely coincident with the reference color, the coincidence degree C. is 1000.

The display section 107 displays on the display panel 18 the coincidence degree C. calculated by the coincidence degree calculating section 114. Although the set ($r_k$, $g_k$, $b_k$) of $r_k$, $g_k$, $b_k$ as the ratio of the light receiving amount levels of the respective colors has been exemplified as the color information, in the present invention, the configuration of the color information is not restricted to this example. For example, a set ($R_k$, $G_k$, $B_k$) of the light receiving amount level of the red light, the light receiving amount level of the green light, and the light receiving amount level of the blue light may be used as the color information. Further, the color information is not restricted to the RGB color system, but a set made up of values of respective color components based on a color system such as Lab may be taken as the color information.

The detection signal generating section 115 compares the coincidence degree C., calculated by the coincidence degree calculating section 114, with a previously defined determination threshold Cd to perform the workpiece determination. The detection signal generating section 115 then generates a detection signal and outputs it to the input/output section 106. The detection signal is generated based on the result of the workpiece determination. In an operation mode, the coincidence degree C. is calculated every time the color information is newly acquired, and the workpiece determination is performed.

Based on the operation signal from the operation section 108, the mode switching section 117 switches the operation mode at the operating time to any of a tuning free mode, a matching mode, and one-spot mode.

The tuning free mode is a difference mode to perform the workpiece determination based on a color difference between the two light projection spots SPa, SPb, and is an operation mode not requiring registration of the reference color.

In the tuning free mode, the color information ($r_{1a}$, $g_{1a}$, $b_{1a}$) corresponding to the reflected light 3 from the light projection spot SPa is compared with the color information ($r_{1b}$, $g_{1b}$, $b_{1b}$) corresponding to the reflected light 3 from the light projection spot SPb to obtain the coincidence degree C. of the two pieces of color information. A color difference is obtained from this coincidence degree C., and is then compared with a determination threshold Cd to perform the workpiece determination.

Meanwhile, the matching mode is an operation mode where the two pieces of color information ($r_{1a}$, $g_{1a}$, $b_{1a}$), ($r_{1b}$, $g_{1b}$, $b_{1b}$) are respectively compared with the previously registered color information ($r_{0a}$, $g_{0a}$, $b_{0a}$), ($r_{0b}$, $g_{0b}$, $b_{0b}$) of the reference color to perform the workpiece determination. In the matching mode, the first color information ($r_{0a}$, $g_{0a}$, $b_{0a}$) and the second color information ($r_{0b}$, $g_{0b}$, $b_{0b}$) are acquired in accordance with the capture instruction by the capture instruction accepting section 113, and stored into the reference color storing section 112 as the reference color. The color information ($r_{0a}$, $g_{0a}$, $b_{0a}$) is the first color information corresponding to the reflected light 3 from the light projection spot SPa. Meanwhile, the color information ($r_{0a}$, $g_{0a}$, $b_{0a}$) is the second color information corresponding to the reflected light 3 from the light projection spot SPb.

Further, in the matching mode, the current color information ($r_{1a}$, $g_{1a}$, $b_{1a}$) is compared with the color information ($r_{0a}$, $g_{0a}$, $b_{0a}$) of the reference color to obtain a coincidence degree Ca of the two pieces of color information, and the current color information ($r_{1b}$, $g_{1b}$, $b_{1b}$) is compared with the color information ($r_{0b}$, $g_{0b}$, $b_{0b}$) of the reference color to obtain a coincidence degree Cb of the two pieces of color information. The workpiece determination is performed by respectively comparing the coincidence degrees Ca, Cb with determination thresholds Cad, Cbd.

For example, when both the coincidence degrees Ca, Cb are higher than the determination thresholds Cad, Cbd, the photoelectric switch 1 shifts to the on-state. On the other hand, when both the coincidence degrees Ca, Cb are not higher than the determination thresholds Cad, Cbd, the photoelectric switch 1 shifts to the off-state.

Alternatively, the determination thresholds Cad, Cbd are the common value Cd, and when the lower one of the coincidence degrees Ca, Cb is higher than the determination threshold Cd, the photoelectric switch 1 shifts to the on-state. On the other hand, when the lower one of the coincidence degrees Ca, Cb is not higher than the determination threshold Cd, the photoelectric switch 1 shifts to the off-state.

Alternatively, when both the coincidence degrees Ca, Cb are higher than the determination thresholds Cad, Cbd, the photoelectric switch 1 shifts to the on-state, whereas when either the coincidence degree Ca or Cb is not higher than the determination threshold Cad or Cbd, the photoelectric switch 1 shifts to the off-state. The determination thresholds Cad, Cbd and the conditions for the state shifting as thus described are previously set as matching parameters.

The one-spot mode is an operation mode where either the color information ($r_{1a}$, $g_{1a}$, $b_{1a}$) or ($r_{1b}$, $g_{1b}$, $b_{1b}$) is compared with the corresponding color information of the reference color to perform the workpiece determination. In the one-spot mode, the current color information ($r_{1a}$, $g_{1a}$, $b_{1a}$) or ($r_{1b}$, $g_{1b}$, $b_{1b}$) is compared with the color information ($r_{0a}$, $g_{0a}$, $b_{0a}$) or ($r_{0b}$, $g_{0b}$, $b_{0b}$) of the reference color to obtain the coincidence degree C. of the two pieces of color information. The workpiece determination is performed by comparing the coincidence degree C. with the determination threshold Cd.

In the tuning free mode, when the light receiving amount of the reflected light 3 from either the light projection spots SPa or SPb is not higher than a certain level, the color information is processed as being black. In the matching mode and the one-spot mode, when the light receiving amount of the reflected light 3 from either the light projection spots SPa or SPb is not higher than a certain level, it is considered that an error has occurred and processing is performed accordingly.

The capture instruction accepting section 113 accepts a capture instruction for color information for correction based on the operation signal from the operation section 108, and instructs the color information acquiring section 111 to capture color information. In the tuning free mode, the corrected amount calculating section 116 obtains a corrected amount for adjusting the zero point of the color difference based on first color information ($r_{2a}$, $g_{2a}$, $b_{2a}$) and second color information ($r_{2b}$, $g_{2b}$, $b_{2b}$) acquired in accordance with the capture instruction by the capture instruction accepting section 113.

For example, correction factors $k_{ra}$, $k_{ga}$, $k_{ba}$ are obtained such that a light receiving amount ratio $r_{2a}$, $g_{2a}$, $b_{2a}$ is respectively coincident with a light receiving amount ratio $r_{2b}$, $g_{2b}$, $b_{2b}$. Further, a correction factor Ka is obtained such that a sum of the light receiving amounts (total light receiving amount): $M_{2a}=(R_{2a}+G_{2a}+B_{2a})$ is coincident with $M_{2b}=(R_{2b}+G_{2b}+B_{2b})$.

The color difference between the light projection spots SPa and SPb may change due to temperature characteristics or a temporal change of the light projecting optical system or the light receiving optical system. In such a case, the light receiving amount is corrected such that the color difference between the light projection spots SPa and SPb is zero by using a master workpiece such as a white workpiece. Note that it may be configured such that the light receiving amounts $R_{2a}$, $G_{2a}$, $B_{2a}$, $R_{2b}$, $G_{2b}$, $B_{2b}$ themselves are corrected.

The detection signal generating section 115 performs the workpiece determination based on the color information ($r_{1a}$, $g_{1a}$, $b_{1a}$) and ($r_{1b}$, $g_{1b}$, $b_{1b}$) after corrected by use of the corrected amounts. That is, the coincidence degree calculating section 114 respectively multiplies the current color information $r_{1a}$, $g_{1a}$, $b_{1a}$ by the correction factors $k_{ra}$, $k_{ga}$, $k_{ba}$ to obtain the color information ($r_{1a}$, $g_{1a}$, $b_{1a}$) after corrected, and compares it with the color information ($r_{1b}$, $g_{1b}$, $b_{1b}$) to calculate the coincidence degree C. The detection signal generating section 115 obtains a color difference from this coincidence degree C. and compares it with the determination threshold Cd, to perform the workpiece determination.

By correcting the color information in this manner, the color combination of the light source changes between the first light projecting unit and the second light projecting unit, or even when there is variation in characteristics between the light receiving element that receives the reflected light 3 from the first detection area and the light receiving element that receives the reflected light 3 from the second detection area, the color difference is adjusted, whereby it is possible to prevent deterioration in detection accuracy.

Figure 11:
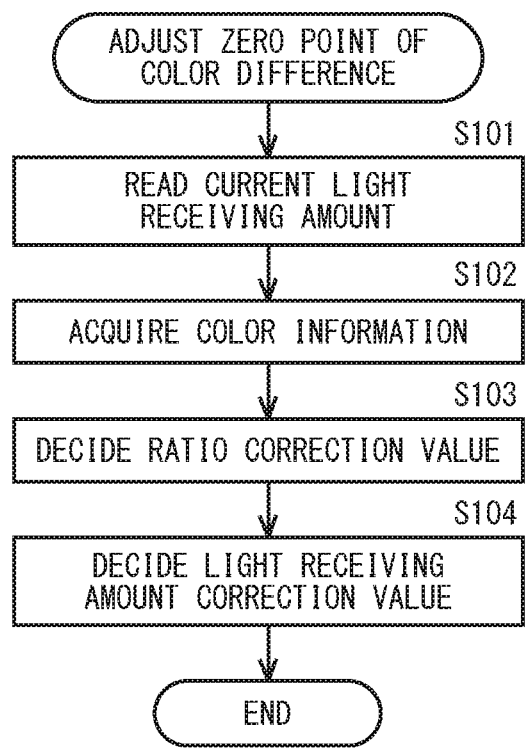
FIG. 11 is a flowchart showing one example of operation at the time of adjusting a zero point of a color difference in the photoelectric switch of FIG. 9.

Steps S101 to S104 of FIG. 11 are a flowchart showing one example of operation at the time of adjusting the zero point of the color difference in the photoelectric switch 1 of FIG. 9. The figure shows processing steps after detection of press operation performed on the operation key 13 at the tuning free mode time.

First, the main control section 100 sequentially reads the current light receiving amounts $R_{2a}$, $G_{2a}$, $B_{2a}$, $R_{2b}$, $G_{2b}$, $B_{2b}$, to acquire the color information ($r_{2a}$, $g_{2a}$, $b_{2a}$) and ($r_{2b}$, $g_{2b}$, $b_{2b}$) at a light receiving amount ratio $r_k$, $g_k$, $b_k$ for the respective color components (Steps S101, S102).

Next, the main control section 100 respectively decides ratio correction values for correcting the light receiving amount ratio, namely, correction factors $k_{ra}$, $k_{ga}$, $k_{ba}$ based on the acquired color information ($r_{2a}$, $g_{2a}$, $b_{2a}$) and ($r_{2b}$, $g_{2b}$, $b_{2b}$) (Step S103).

Next, the main control section 100 decides a light receiving amount correction value for correcting a total light receiving amount, namely a correction factor Ka, based on the current light receiving amounts $R_{2a}$, $G_{2a}$, $B_{2a}$, $R_{2b}$, $G_{2b}$, $B_{2b}$ (Step S104). The main control section 100 stores the correction factors $k_{ra}$, $k_{ga}$, $k_{ba}$ and Ka as parameters for zero-point adjustment.

Figure 12:
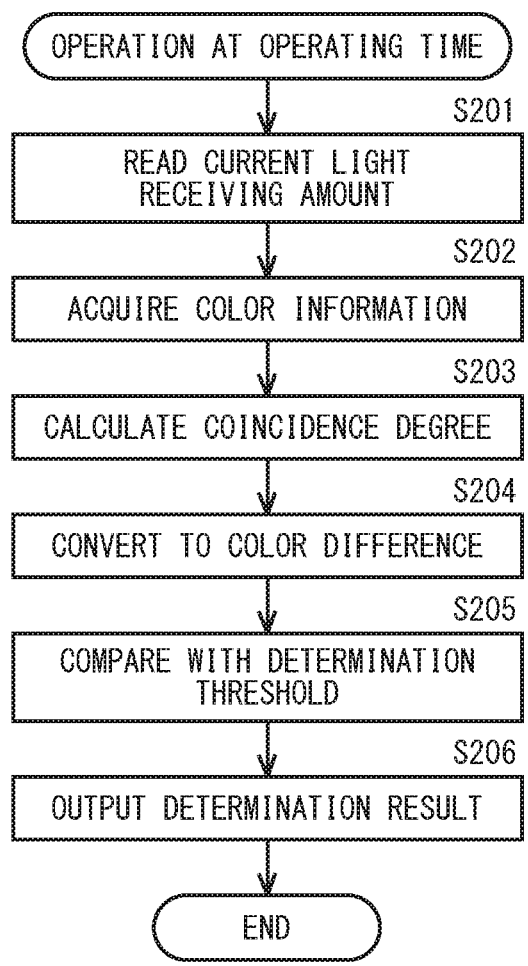
FIG. 12 is a flowchart showing one example of operation at the operating time in the photoelectric switch of FIG. 9.

Steps S201 to S206 of FIG. 12 are a flowchart showing one example of operation at the operating time in the photoelectric switch 1 of FIG. 9, and shows a case where the operation mode is the tuning free mode. During the operation, the processing steps from Steps S201 to S206 are periodically repeated.

First, the main control section 100 sequentially reads the current light receiving amounts $R_{1a}$, $G_{1a}$, $B_{1a}$, $R_{1b}$, $G_{1b}$, $B_{1b}$, to acquire the color information ($r_{1a}$, $g_{1a}$, $b_{1a}$) and ($r_{1b}$, $g_{1b}$, $b_{1b}$) at the light receiving amount ratio $r_k$, $g_k$, $b_k$ for the respective color components (Steps S201, S202). At this time, the main control section 100 corrects color information ($r_{1a}$, $g_{1a}$, $b_{1a}$) by use of the correction factors $k_{ra}$, $k_{ga}$, $k_{ba}$, and Ka.

Next, based on the acquired color information ($r_{1a}$, $g_{1a}$, $b_{1a}$) and ($r_{1b}$, $g_{1b}$, $b_{1b}$), the main control section 100 calculates the coincidence degree C. of the two pieces of color information and converts it to a color difference (Steps S203, S204). Specifically, the coincidence degree C. of the color information ($r_{1b}$, $g_{1b}$, $b_{1b}$) with respect to the color information ($r_{1a}$, $g_{1a}$, $b_{1a}$) after corrected is calculated.

Next, the main control section 100 compares the calculated color difference with the determination threshold Cd to perform the workpiece determination, and outputs the determination result (Steps S205, S206). Specifically, when the color difference is larger than the determination threshold Cd, the on-state is selected. On the other hand, when the color difference is not larger than the determination threshold Cd, the off-state is selected.

Figure 13:
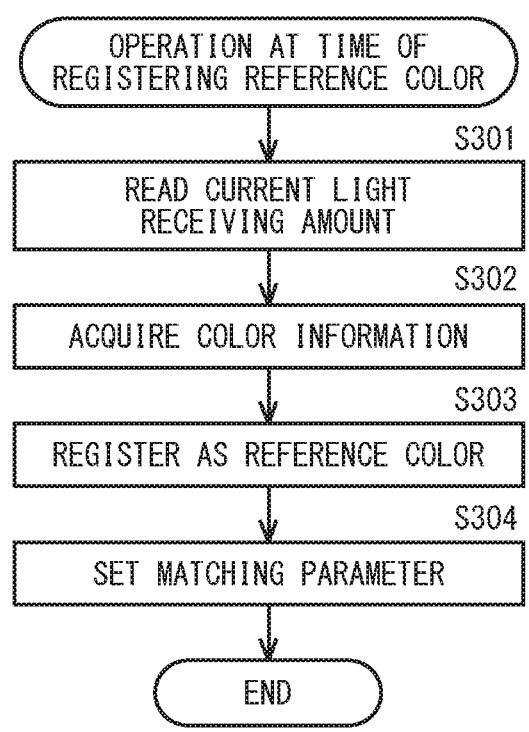
FIG. 13 is a flowchart showing one example of operation at the time of registering a reference color in the photoelectric switch of FIG. 9.

Steps S301 to S304 of FIG. 13 are a flowchart showing one example of operation at the time of registering the reference color in the photoelectric switch 1 of FIG. 9. The figure shows processing steps after detection of press operation performed on the operation key 13 at the matching mode time.

First, the main control section 100 sequentially reads the current light receiving amounts $R_{0a}$, $G_{0a}$, $B_{0a}$, $R_{0b}$, $G_{0b}$, $B_{0b}$, to acquire the color information ($r_{0a}$, $g_{0a}$, $b_{0a}$) and ($r_{0b}$, $g_{0b}$, $b_{0b}$) at the light receiving amount ratio $r_k$, $g_k$, $b_k$ for the respective color components (Steps S301, S302).

Next, the main control section 100 registers the current color information ($r_{0a}$, $g_{0a}$, $b_{0a}$) and ($r_{0b}$, $g_{0b}$, $b_{0b}$) as the reference colors (Step S303). Next, the main control section 100 sets matching parameters such as the determination thresholds Cad, Cbd and the conditions for the state shifting based on variation in light receiving amount or variation in light receiving amount ratio (Step S304).

Figure 14:
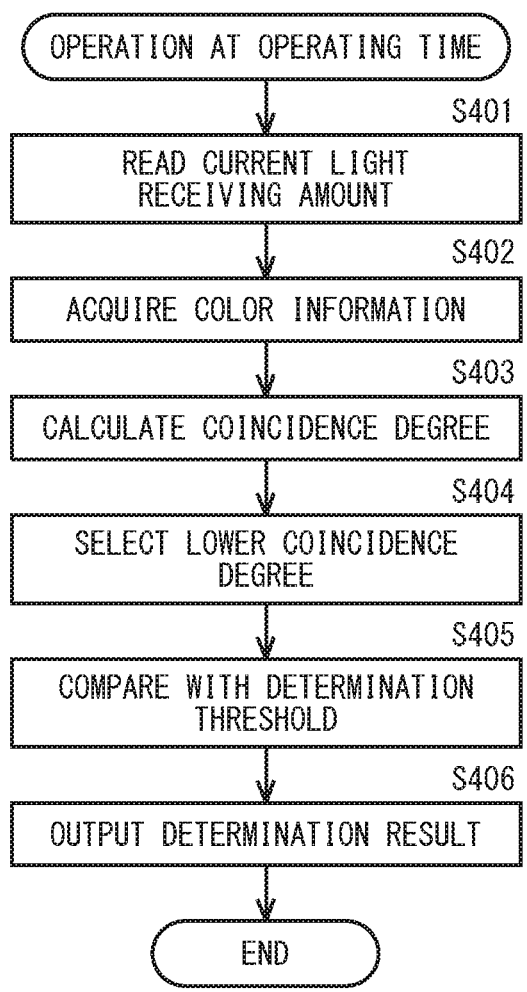
FIG. 14 is a flowchart showing one example of operation at the operating time in the photoelectric switch of FIG. 9.

Steps S401 to S406 of FIG. 14 are a flowchart showing one example of operation at the operating time in the photoelectric switch 1 of FIG. 9, and shows a case where the operation mode is the matching mode. During the operation, the processing steps from Steps S401 to S406 are periodically repeated.

First, the main control section 100 sequentially reads the current light receiving amounts $R_{1a}$, $G_{1a}$, $B_{1a}$, $R_{1b}$, $G_{1b}$, $B_{1b}$, to acquire the color information ($r_{1a}$, $g_{1a}$, $b_{1a}$) and ($r_{1b}$, $g_{1b}$, $b_{1b}$) at the light receiving amount ratio $r_k$, $g_k$, $b_k$ for the respective color components (Steps S401, S402).

Next, the main control section 100 respectively compares the acquired color information ($r_{1a}$, $g_{1a}$, $b_{1a}$) and ($r_{1b}$, $g_{1b}$, $b_{1b}$) with the color information ($r_{0a}$, $g_{0a}$, $b_{0a}$) and ($r_{0b}$, $g_{0b}$, $b_{0b}$) of the reference color, to calculate the coincidence degrees Ca, Cb of the two pieces of color information (Step S403).

Next, the main control section 100 selects the lower one of the calculated coincidence degrees Ca, Cb as a matching value (Step S404), and compares it with the determination threshold Cd to perform the workpiece determination, and then outputs the determination results (Steps S405, 406). Specifically, when the matching value is larger than the determination threshold Cd, the on-state is selected. On the other hand, when the matching value is not larger than the determination threshold Cd, the off-state is selected.

According to the present embodiment, since the workpiece determination is performed based on the color information ($r_{1a}$, $g_{1a}$, $b_{1a}$) and ($r_{1b}$, $g_{1b}$, $b_{1b}$) obtained by sequentially projecting the detected lights 2a, 2b, it is possible to improve the detection accuracy as compared with the case of performing the workpiece determination only by use of either ($r_{1a}$, $g_{1a}$, $b_{1a}$) or ($r_{1b}$, $g_{1b}$, $b_{1b}$).

Especially when the tuning free mode is selected, a difference in color combination between the light projection spots SPa and SPb is detected. Hence at the time of detecting a label, an assembled component, a register mark RM, or the like on the workpiece W, it is possible to reduce influences by color fade-out of the workpiece W, variation in color combination among manufacturing lots of workpieces W, adherence of contamination to the optical surface of the photoelectric switch 1, and flapping of the carrier device. Further, since the coincidence degree C. is obtained from the color information ($r_{1a}$, $g_{1a}$, $b_{1a}$) and ($r_{1b}$, $g_{1b}$, $b_{1b}$), there is no need to register the reference color in advance of the workpiece determination. For example, when a detection target is a register mark printed on a sheet-like member such as a film for packaging with an abundant variety of colored patterns, the color of the register mark may change in accordance with the variation in colored pattern due to a set-up change. Even in such a case, when the mode is the tuning free mode, it is easy to cope with the set-up change because of the unnecessity for registering the reference color.

Further, when the matching mode is selected, the color discrimination on the first detection area and the color discrimination on the second detection area can be combined to perform the workpiece determination. For this reason, it is possible to detect a region or the like on the workpiece W having a predetermined color difference between the first detection area and the second detection area. For example, even when the register mark RM is not printed on the cut position or the label pasted position, if it is a region having a predetermined color difference, the region can be detected by the photoelectric switch 1.

In the present embodiment, the example of the case has been described where color information is acquired to perform the workpiece determination. However, in the present invention, the method for the workpiece determination is not restricted to this example. For example, it may be configured such that the workpiece determination is performed based on the light receiving amount of the reflected light 3 from the detection area. In this case, the detection signal generating section 115 performs the workpiece determination based on at least one color component of the first light receiving amount and the second light receiving amount corresponding to the reflected light 3 from the first detection area and the reflected light 3 from the second detection area.

In the present embodiment, the example of the case has been described where the space and the sizes of the light projection spots SPa, SPb are generally constant in the vicinity of the focal position. However, in the present invention, the configuration of the light projecting optical system is not restricted to this example. For example, the light projecting optical system may be configured to have an adjustment system for adjusting the space between the light projection spots SPa and SPb, the sizes (spot diameters) of the light projection spots SPa, SPb, or an angle of the light axis between the detected lights 2a and 2b.

In the present embodiment, the example of the case has been described where the two light emitting elements 21a, 21b are sequentially turned on in a time-division manner to sequentially project the detected lights 2a, 2b in a time-division manner. However, the present invention is also applicable to a configuration where a light from one light emitting element is divided to obtain the detected lights 2a, 2b.

In the present embodiment, the example of the case has been described where the first light projecting unit has the light emitting elements 21a, the slit 22, and the light projecting lenses 23a, and the second light projecting unit has the light emitting elements 21b, the slit 22, and the light projecting lenses 23b. However, in the present invention, the configurations of the first light projecting unit and the second light projecting unit are not restricted to this example. For example, a common light emitting elements may be used as the light emitting elements 21a, 21b. Further, a common light projecting lens may be used as the light projecting lenses 23a, 23b. In the photoelectric switch 1 according to the present invention, the slit 22 is not necessarily required to be provided in the first light projecting unit and the second light projecting unit, but it may be configured such that a light guiding member such as an optical fiber is provided between the light emitting element and the light projecting lens. Moreover, it may be configured such that a point light source such as a laser is used as the light emitting element to eliminate the need for the slit 22.

In the present embodiment, the example of the case has been described where the common light receiving unit is provided corresponding to the first detected light from the first light projecting unit and the second detected light from the second light projecting unit. However, in the present invention, the configuration of the light receiving unit is not restricted to this example. For example, PD units respectively corresponding to the first detected light from the first light projecting unit and the second detected light from the second light projecting unit may be provided. In this case, light projecting lenses may be separately provided corresponding respectively to the first detected light from the first light projecting unit and the second detected light from the second light projecting unit. Alternatively, a common light projecting lens may be provided.

In the present embodiment, the example of the case has been described where the reflected light 3 is received from the workpiece W to acquire color information, and the workpiece determination is performed based on the color combination of the workpiece W. However, in the present invention, the method for the workpiece determination is not restricted to this example. For example, it may be configured such that polarization filters are used for the light projecting optical system and the light receiving optical system to remove a regular reflection component from the reflected light 3. By removing the regular reflection component by use of the polarization filter, the color combination of the workpiece W can be accurately discriminated without being affected by a change in color combination of the light source for light projection.

Further, in the present embodiment, there has been described the example of the case where the coincidence degree C. is calculated based on the ratio $r_k$, $g_k$, $b_k$ of the light receiving amount levels of the three colors, but in the present invention, the method for calculating the coincidence degree C. is not restricted to this example. It may be configured such that the coincidence degree C. is obtained based on the ratio $r_k$, $g_k$, $b_k$ of the light receiving amount levels of the three colors and a sum $M_k$ of the light receiving amounts. By using such a coincidence degree C., it is possible to accurately detect not only a chromatic workpiece but also such a workpiece where the hue and the chroma are in the same range and only the brightness greatly changes, especially an achromatic workpiece having white-and-black shades.

Further in the present embodiment, the example of the case has been described where the capture instruction for the color information for correction or the reference color is input based on the press operation performed on the operation key 13. However, in the present invention, the method for instructing to capture color information for correction and a reference color is not restricted to this example. For example, it may be configured such that the color information for correction or the color information of the reference color is captured based on a timing signal or a trigger signal input from the external equipment such as the controller.

In the present embodiment, the example of the case has been described where the white light containing two or more color components with different hues is used as the detected light. However, in the present invention, the light source for light projection is not restricted to this example. For example, three light emitting elements that respectively generate a red light, a green light, and a blue light may be included as the light source for light projection, and it may be configured such that the light emitting elements are sequentially turned on in a time-division manner, to project detected lights corresponding to three specific wavelengths of red, green, and blue toward the detection area. Further, it may be configured such that the three light emitting elements of the red light, the green light, and the blue light are simultaneously turned on, to project a detected light made up of a white light obtained by mixing the red light, the green light, and the blue light.

In the present embodiment, the example of the case has been described where the reflected light 3 is received using the PD unit 41. However, in the present invention, the configuration of the light receiving unit is not restricted to this example. For example, it may be configured so as to include, as the light receiving unit, a spectroscope for dispersing the reflected light 3 into the three color components of red, green, and blue, and three light receiving elements for receiving the respective color components. Alternatively, it may be configured so as to include one light receiving element as the light receiving unit when the red, green, and blue detected lights are to be sequentially projected in a time-division manner.

What is claimed is:

1. A photoelectric switch comprising:
a first light projector configured to project a first light corresponding to two or more specific wavelengths toward a first detection area;
a second light projector configured to project a second light corresponding to the two or more specific wavelengths toward a second detection area;
a light receiver configured to receive the first light reflected from the first detection area to generate a first light reception signal, and configured to receive the second light reflected from the second detection area to generate a second light reception signal;
a casing accommodating the first light projector, the second light projector, and the light receiver; and
a detection signal generator configured to generate a detection signal based on at least one of the specific wavelength components of the first light reception signal and at least one of the specific wavelength components of the second light reception signal.

2. The photoelectric switch according to claim 1, further comprising
a color information generator configured to generate a first color information based on at least two of the specific wavelength components of the first light reception signal, and configured to generate a second color information based on at least two of the specific wavelength components of the second light reception signal,
wherein the detection signal generator is configured to generate the detection signal based on the first color information and the second color information.

3. The photoelectric switch according to claim 2, further comprising
a coincidence degree calculator configured to calculate a coincidence degree of the first color information and the second color information,
wherein the detection signal generator is configured to compare the coincidence degree with a predetermined threshold to generate the detection signal.

4. The photoelectric switch according to claim 3, further comprising:
a capture instruction receiver configured to receive a first capture instruction of a color difference; and
a corrected amount calculator configured to calculate a correction amount to correct a zero point of the color difference between the first color information generated based on the first light reception signal generated in response to the first capture instruction and the second color information generated based on the second light reception signal generated in response to the first capture instruction,
wherein the detection signal generator is configured to compare the coincidence degree with a predetermined threshold by using the correction amount to generate the detection signal.

5. The photoelectric switch according to claim 2, further comprising:
a capture instruction receiver configured to receive a second capture instruction of a reference color;
a reference color memory configured to store the first color information, as a first reference color, generated based on the first light reception signal generated in response to the second capture instruction, and the second color information, a second reference color, generated based on the second light reception signal generated in response to the second capture instruction; and
a coincidence degree calculator configured to calculate a first coincidence degree of the first color information and the first reference color, and configured to calculate a second coincidence degree of the second color information and the second reference color,
wherein the detection signal generator is configured to generate the detection signal based on the first coincidence degree and the second coincidence degree.

6. The photoelectric switch according to claim 1, wherein
the first light projector projects, as the first light, a white light containing two or more color components with different hues,
the second light projector projects, as the second light, a white light containing two or more color components with different hues,
the light receiver has two or more light receiving elements for each selectively receiving a reflected light from the detection area in association with the two or more specific wavelengths.

\* \* \* \* \*